METHOD OF MAKING A SEMICONDUCTOR DEVICE

Filed March 14, 1967

INVENTORS
Keiichi Nakamura
Akira Misawa

BY Hill, Sherman, Meroni, Gross & Simpson ATTORNEYS

METHOD OF MAKING A SEMICONDUCTOR DEVICE

Filed March 14, 1967 5 Sheets-Sheet 2

INVENTORS
Keiichi Nakamura
Akira Misawa
BY Hill, Sherman, Meroni, Gross & Simpson ATTORNEYS

METHOD OF MAKING A SEMICONDUCTOR DEVICE

Filed March 14, 1967 5 Sheets-Sheet 5

INVENTORS
Keiichi Nakamura
Akira Misawa

BY Hill, Sherman, Meroni, Gross & Simpson ATTORNEYS

METHOD OF MAKING A SEMICONDUCTOR DEVICE

Filed March 14, 1967 5 Sheets-Sheet 4

INVENTORS
Keiichi Nakamura
Akira Misawa
BY Hill, Sherman, Meroni, Gross & Simpson ATTORNEYS

METHOD OF MAKING A SEMICONDUCTOR DEVICE

Filed March 14, 1967

5 Sheets-Sheet 5

INVENTORS
Keiichi Nakamura
Akira Misawa

BY Hill, Sherman, Meroni, Gross & Simpson ATTORNEYS

United States Patent Office 3,492,174
Patented Jan. 27, 1970

3,492,174

METHOD OF MAKING A SEMICONDUCTOR DEVICE

Keiichi Nakamura, Tokyo, and Akira Misawa, Kanagawa-ken, Japan, assignors to Sony Corporation, Tokyo, Japan, a corporation of Japan Filed Mar. 14, 1967, Ser. No. 623,011
Claims priority, application Japan, Mar. 19, 1966, 41/16,989, 41/16,990
Int. Cl. H01l 7/34, 7/36
U.S. Cl. 148—175 10 Claims

ABSTRACT OF THE DISCLOSURE

Passivated semiconductor devices in which the P-N junctions are protected by a glassy layer produced by diffusing a glass former into the semiconductor under oxidizing conditions.

BACKGROUND OF THE INVENTION

Field of the invention

This invention is directed to a passivated semiconductor device and to a method of making the same, wherein exposed P-N junctions are protected by the interposition of a glassy type layer formed by reaction of the substrate with a glass forming material under oxidizing conditions at a temperature below the melting point of the substrate.

DESCRIPTION OF THE PRIOR ART

It is known that semiconductor devices are subject to deterioration at the sites of their P-N junctions, particularly where the junction is at or near the surface. The deterioration may bridge the junction, thus degrading the device for high temperature operation, and for operation under conditions of high reverse voltages.

In the past, it has been suggested that an oxide surface layer of the semiconductor material be formed over the surface of the semiconductor device at suitably elevated temperatures. In the case of a silicon substrate, oxidation is typically accomplished at temperatures ranging from about 1100 to 1400° C. This severe oxidation treatment sometimes leads to channeling under the oxide layer, and mechanical distortion resulting from the difference between the thermal expansion coefficients of the substrate and the oxide layer. This oxidation treatment may also result in producing variations in the electrical characteristics of the device. In addition, the high temperature treatment used in forming the oxide layer tended to cause diffusion in the areas of the P-N junctions.

SUMMARY OF THE INVENTION

The present invention provides a method for forming a passivating layer at a relatively low temperature about a P-N junction, thereby inhibiting the formation of a channel under the layer so that the device is free from short-circuiting between the electrodes and has excellent reverse voltage characteristics. By suitable selection of materials, the thermal expansion coefficients of the glassy layer and the substrate can be rendered essentially equal, so that the device can operate under severe thermal conditions for a long period of time. In addition, the device of the present invention has the P-N junctions not exposed on the surface so that the semiconductor devices produced according to this invention can be used under conditions of high voltage.

The passivated semiconductor of the present invention employs a material which can be readily oxidized and combined with a semiconductor substrate at a temperature lower than the melting point of the substrate. Typically, the glass former is deposited on the substrate by vapor deposition, and the substrate is then heated in an oxygen atmosphere so that the glass former combines with the substrate and at the same time the resulting alloy is oxidized, providing a glassy layer at a relatively low temperature. The heating temperature is dependent upon the material of the substrate and the nature of the glass former. With a silicon substrate, the glass layer can be formed at temperatures ranging from about 500 to 1000° C. The preferred glass former in accordance with the present invention is lead but other elements such as aluminum, beryllium, magnesium, zinc, cadmium, and tin, can also be employed.

DESCRIPTION OF THE PREFERRED EMBODIMENTS

In the succeeding description, the method of the present invention will be described as applied to the manufacture of silicon semiconductor devices using lead or lead oxide as the glass forming material.

Figure 1:
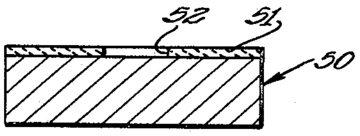
FIGURES 1 to 6, inclusive, are greatly enlarged cross-sectional views of the successive steps involved in producing a passivated semiconductor in accordance with the present invention.
Figure 2:
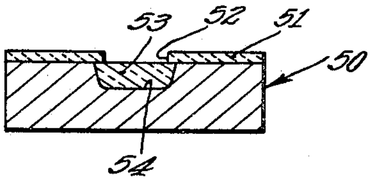

In FIGURE 1, reference numeral 50 indicates generally a single crystal semiconductor substrate such as a P-type silicon substrate. The substrate 50 is heated to a temperature of approximately 1100° C. in an oxidizing atmosphere, thereby forming an oxide layer 51 composed of silicon dioxide. Next, the oxide layer 51 is selectively removed in a predetermined area, forming a window 52 through which one portion of the surface of the P-type silicon substrate 50 is exposed. Then, a donor impurity such as phosphorous or the like is diffused into the silicon substrate 50 through the window 52 to provide an N-type region 53 and a P-N junction 54 between the two regions of different conductivity types, as illustrated in FIGURE 2 of the drawings.

Figure 3:
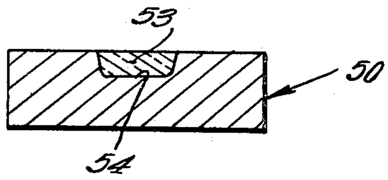
Figure 4:
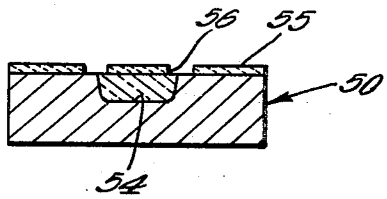
Figure 5:
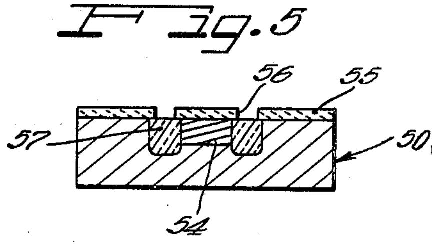

Subsequent to the formation of the P-N junction 54, the remaining oxide layer 51 is entirely removed as illustrated in FIGURE 3 of the drawings. A metal mask 55 is then applied over the entire surface of the silicon substrate 50 except for an area 56 which overlies the portion of the substrate 50 in which the P-N junction is exposed at the surface. The formation of the metal mask 55 may be accomplished by vacuum deposition of a metal such as molybdenum, platinum, or tungsten or other metal which does not react with silicon or with lead or lead oxide. Following this, lead or lead oxide is vacuum deposited into the substrate as illustrated in FIGURE 5, and the silicon substrate containing the diffused lead or lead oxide is heated in an oxidizing atmosphere at a temperature, for example, of approximately 800° C. to provide a glassy layer 57 in the silicon substrate 50 downwardly from the surface of the substrate. Consequently, the P-N junction 54 in the region of the substrate surface is masked by the glassy layer 57. This reduces the possibility of contamination of the P-N junction by the atmosphere, improving the reliability of diode operation.

Figure 6:
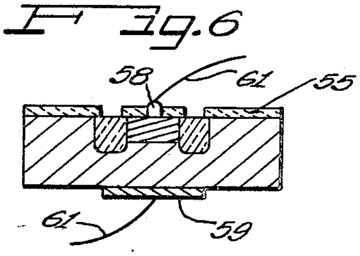

After the formation of the glassy layer 57, an electrode is attached to the N-type region. For this purpose, the metal mask 55 can be selectively etched by the use of sulphuric acid or nitric acid and a material such as a commercially available photoresist is coated on the exposed surface of the N-type region. The coated surface is then subjected to the normal photo etching process to form an electrode 58 as seen in FIGURE 6. A second electrode 59 is applied at the bottom of the silicon substrate 10 and suitable leads 61 can be applied to the two electrodes.

Figure 7:
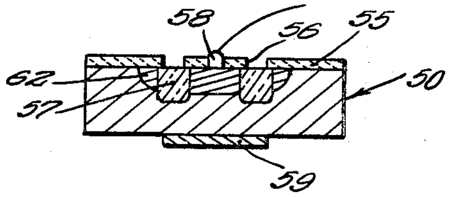
FIGURE 7 is an enlarged cross-sectional view of a modified form of the invention.
Figure 8:
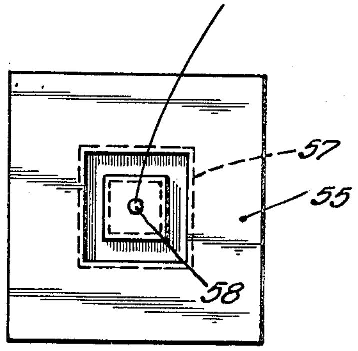
FIGURE 8 is an enlarged plan view of a completed semiconductor device according to the present invention.
Figure 9:
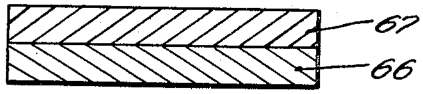
FIGURES 9 to 17 are greatly enlarged cross-sectional views showing the sequence of steps involved in providing a passivated semiconductor of a different type.

It is not always necessary to confine the diffusion of the glass former only into the particular area at which the P-N junction is exposed. In the modified form of the invention illustrated in FIGURE 7, the N-type diffusion area 62 is relatively wider than it is in the showing of the preceding figures, and the mask 55 permits the diffusion of the lead or lead oxide in the area 56 inwardly from the region in which the P-N junction is at the surface of the substrate. Consequently, there is provided an N-type region surrounded by the glassy layer 57 as in the previously described form of the invention, and that portion of the P-N junction which remains outside of the glassy layer 57 is in an inoperative position and does not interfere with the functioning of the finished semiconductor device. The type of structure shown in FIGURE 7 is somewhat preferable in practice to that shown in FIGURES 1 to 6 because the formation of the glassy layer interiorly of the P-N juncton by selective oxidation is easier to accomplish in manufacturing operations than the formation of the glassy layer by the selective oxidation of the exposed area of the P-N junction.

With the foregoing technique, the P-N junction is not exposed on the surface of the semiconductor, and so the impurity concentration on the surface can be increased independently of the junction to provide for good ohmic contact.

Figure 10:
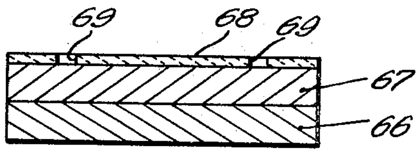
Figure 11:
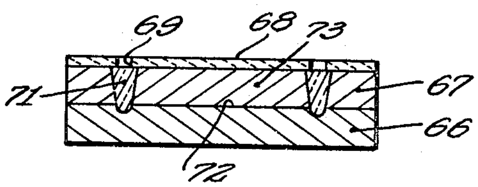

Turning now to the modification shown in FIGURES 9 to 16, inclusive, there is provided a silicon substrate 66 of N-type conductivity, and a P-type conductivity region 67 is formed thereon by epitaxial growth or diffusion techniques. A mask 68, composed for example, a molybdenum is deposited on the entire surface of the P-type region 67 by vapor deposition or the like as shown in FIGURE 10. The metal mask 68 is removed selectively at predetermined areas providing windows 69 therein; the removal being effected by the usual photoetching process. Thereafter, lead or lead oxide is deposited on the exposed portions of the P-type region through the windows 69 and the resulting substrate is heated, for example, to about 800° C. in an oxidizing atmosphere, forming a glassy layer 71 extending from the surface of the P-type region to the interior thereof, the glassy layer extending down past the P-N junction 72 and into the N-type region 66. The central portion of the P-type region 67, identified at reference numeral 73, which is surrounded by the glassy layer 71 ultimately serves as a base of the finished transistor.

Figure 12:
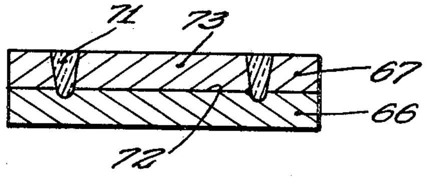
Figure 13:
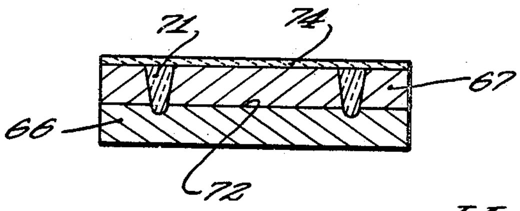
Figure 14:
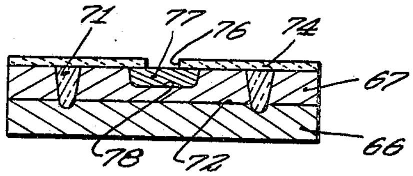

After the formation of the glassy layer, the metal mask 68 is entirely removed by etching with sulphuric acid or nitric acid, leaving the structure shown in FIGURE 12. Then, an oxide layer 74 is provided on the upper surface of the substrate as indicated in FIGURE 13, by usual oxidation procedures. The layer 74 is selectively removed centrally of the upper surface to provide an opening 76, exposing the P-type reigon therethrough, as illustrated in FIGURE 14. Then, a material such as phosphorous or other N-type impurity is diffused into the P-type region 67 through the opening 76 to form an N-type region 77 as also seen in FIGURE 14. The N-type region, isolated by a second P-N junction 78, serves as the emitter of the final transistor.

Figure 15:
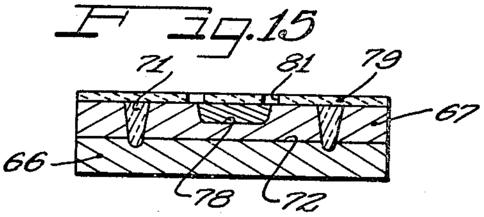
Figure 16:
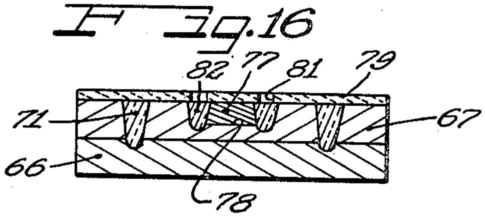
Figure 17:
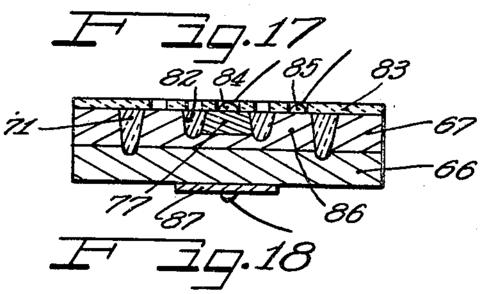

After the provision of the N-type region 77, the oxide layer 74 is removed from the entire surface of the substrate, and a metal mask 79 is deposited on the exposed surface, as shown in FIGURE 15. The mask 79 has an opening 81 which exposes the perimeter of the P-N junction 78. Through this window 81, lead or lead oxide is deposited on the exposed portion by vapor deposition after which the resulting substrate is heated in an oxidizing atmosphere, thereby forming a glassy layer 82 extending down to and beyond the lower extremity of the P-N junction 78. In this way, the region 77 which ultimately serves as the emitter region of the final transistor is surrounded by the glassy layer 82 extending across the P-N junction 78 within the substrate.

Figure 18:
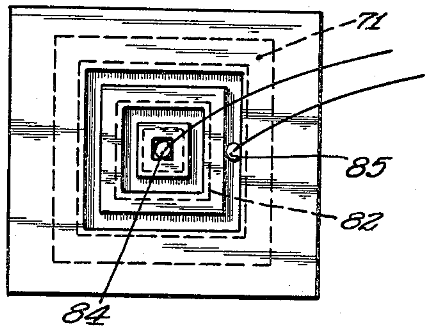
FIGURE 18 is an enlarged plan view of the completed semiconductor device produced according to the method of FIGURES 9 to 17, inclusive.

The next step consists in completely removing the metal mask 79 and then coating the exposed surface with a photoresist material 83 such as "Kodak Photo Resist" and then carrying out the normal photo-etching process for attaching electrodes 84 and 85 on the emitter portion 77 and the base portion 86. Finally, a collector electrode 87 is applied to the bottom of the substrate. The completed transistor is shown in FIGURE 18.

Figure 19:
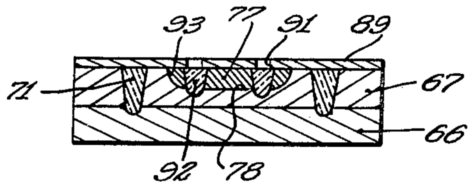
FIGURE 19 is an enlarged cross-sectional view of a somewhat modified form of the device similar to that shown in the preceding figures.
Figure 20:
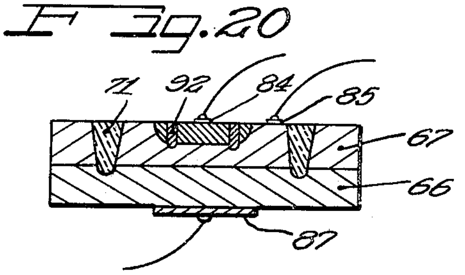
FIGURE 20 is an enlarged cross-sectional view of the completed device produced according to the method shown in FIGURES 9 to 17, inclusive.

FIGURES 19 and 20 illustrate a modification of this technique which simplifies the manufacturing proceeding somewhat. The initial steps of the process are the same as those illustrated in FIGURES 9 through 14. However, the mask 89 which is employed in this embodiment of the invention has an opening 91 which is spaced inwardly from the outer periphery of the N-type zone 77. Lead or lead oxide is diffused through opening 91 to form a glassy layer 92 extending slightly beyond the P–N junction 78. The portion 93 of the P–N junction extending to the surface of the substrate from the outer side of the glassy layer 92 does not participate in the operation of the finished transistor. Electrodes 84, 85 and 87 are attached in the usual way to the emitter, base and collector regions, respectively.

To illustrate the foregoing process by means of a specific example, an N-type silicon substrate was prepared having a specific resistivity of 7 ohm cm. The silicon substrate was etched at its surface and was then heated up to 1200° C. for diffusing boron into the substrate for ten minutes, thus forming on one surface of the substrate a P-type diffusion layer having a thickness of about 0.9 micron. Next, lead oxide was selectively vapor deposited through a mask on the diffusion layer to a depth of approximately 1.5 microns by using a platinum heater. The resulting substrate was heated at a temperature of 800° C., a temperature slightly in excess of the eutectic point of silicon dioxide and lead oxide (PbO) for thirty minutes, thereby forming a glass layer of approximately 2.1 microns in thickness. The diode thus produced had a breakdown voltage of about 130 volts and exhibited excellent passivation and electrical stability.

The preceding description referring to the production of transistor elements made use of two operations in forming the glass layers, but these may occur simultaneously. In this case, however, diffusion of the emittter zone is carried out after the formation of the glass layers. Furthermore, the transistor of the present invention may be produced by diffusing the base and emitter regions into a substrate having previously formed glass layers contained therein.

The following description relates to the production of a plurality of semiconductor circuit elements of the NPN type on a common silicon substrate, with a common collector region.

Figure 21:
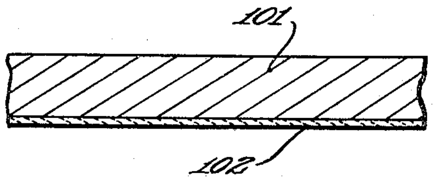
FIGURES 21 to 29 are greatly enlarged cross-sectional views showing the sequence involved in producing a still further modified form of the invention.

Referring to FIGURE 21, an N-type silicon substrate 101 is first prepared, one surface of which is provided with an insulating layer 102 composed of silicon dioxide or the like. After formation of the insulating layer 102, a P-type impurity is diffused into the substrate 101 from its exposed surface, forming a collector junction 103 between an N-type region 104 ultimately serving as a collector region, and a P-type region 105 ultimately serving as a base region.

Figure 24:
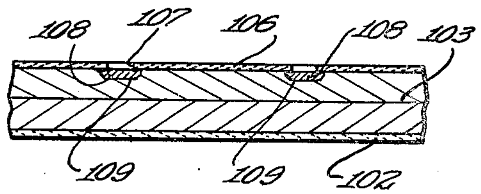
Figure 22:
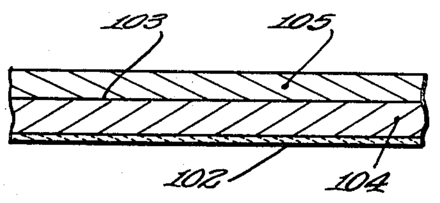
Figure 25:
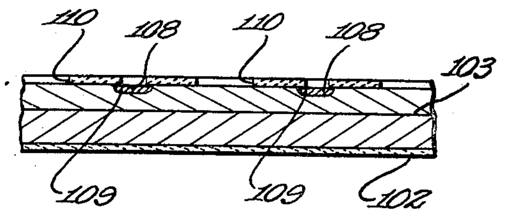
Figure 23:
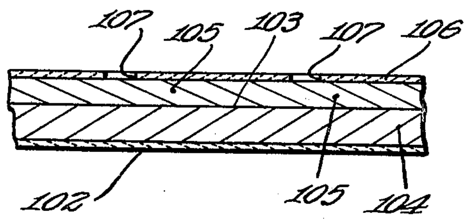
Figure 26:
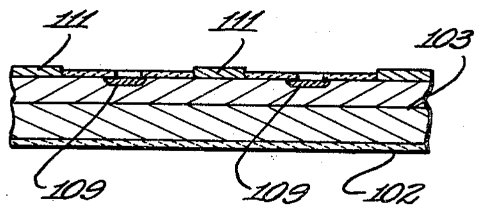

Subsequent to or simultaneously with the diffusion of the P-type impurity, the upper surface of the substrate is provided with an oxide layer 106 composed of silicon dioxide or the like. The insulating layer 106 is selectively removed by a photo-etching process or the like in those areas in which the emitters of the transistors are to be located, resulting in the formation of a plurality of windows 107 as shown in FIGURE 23. Then, an N-type impurtiy is diffused into the P-type region 105 through the windows 107. This provides a plurality of N-type regions 108 ultimately functioning as emitter regions in the finished transistor elements, thereby providing a plurality of emitter junctions 109, illustrated in FIGURE 24. Next, the insulating layer 106 is removed by a photo-etching process selectively in those areas which surround the portions where circuit elements are to be provided, namely, the portions of the finished transistor elements which are to be isolated. The selective removal of the insulating layer 106 results in the formation of windows 110 as illustrated in FIGURE 25. The surface of the substrate exposed through the windows 110 is covered with a metal deposit 111, typically of a thickness of 2 to 10 microns, and being provided by means of vapor deposition. The metal is one which is readily oxidized and which alloys with silicon at a temperature less than the melting point of silicon. Typical metals include magnesium, aluminum, zirconium, beryllium and the like, or alloys containing two or more of the aforementioned metals. The resulting substrate is then preheated to a temperature of, for example, 640° C. to 1100° C., which temperatures are lower than the melting point of silicon (1400° C.) causing the metal 111 to become alloyed with the silicon substrate. The alloying temperature, of course, varies with the metal employed. In the case of magnesium, the silicon substrate will permeate into the magnesium to the extent of about 5% by weight at a temperature of about 800° C.

Figures 27, 28, 29, 30, 31, 32, 33, 34:
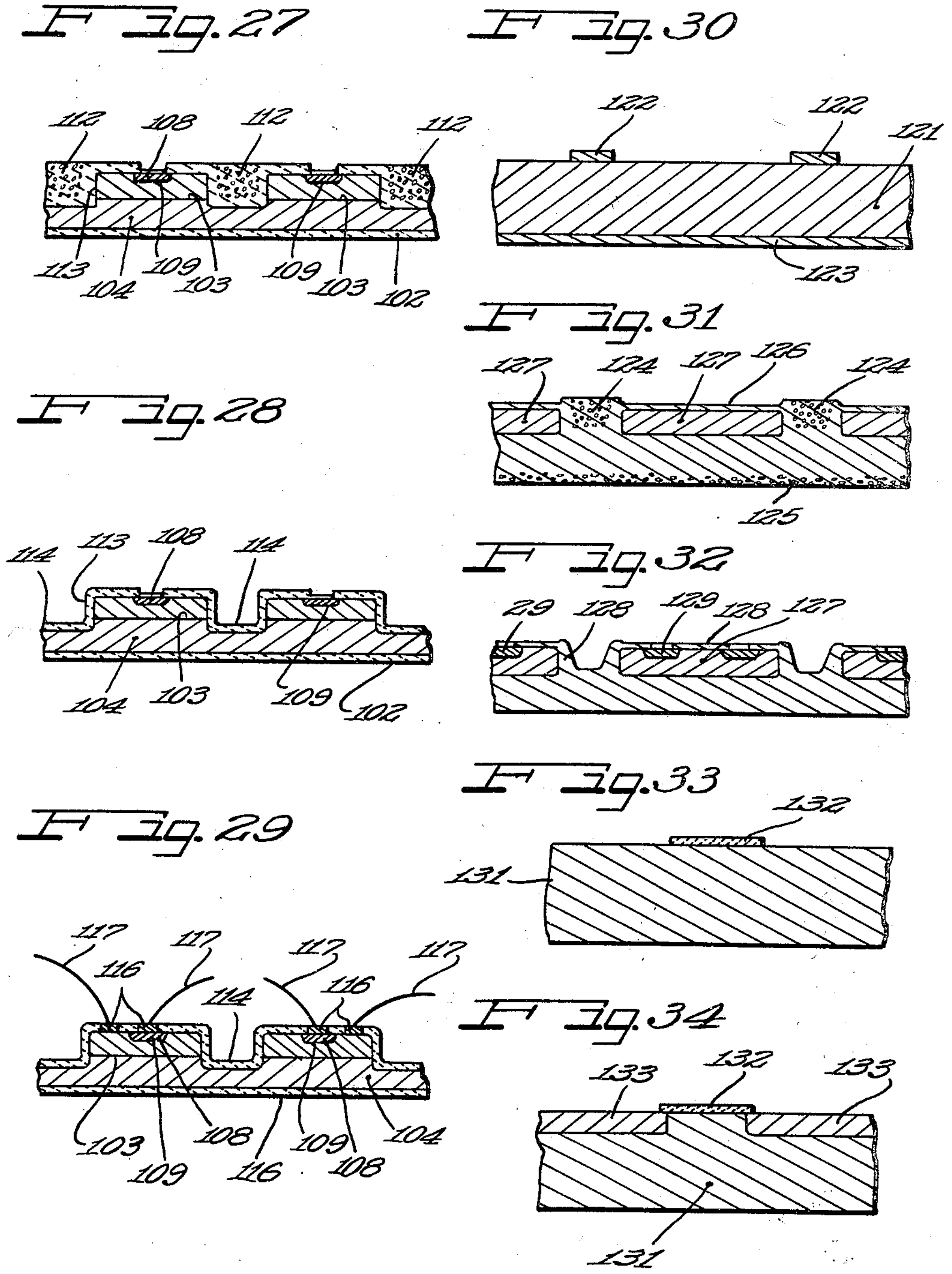
FIGURES 30 to 32, inclusive, are greatly enlarged cross-sectional views showing the preparation of still another modified form of the invention.
FIGURES 33 to 43 are greatly enlarged cross-sectional views of a sequence of steps involved in making a still further modified form of the invention.

The resulting substrate is then subjected to an oxidation treatment at elevated temperatures. The substrate is treated with an oxidizing atmosphere of oxygen, water vapor or the like for ten minutes or so to form isolation layers 112 composed of an oxidation product which extends down to the N-type region 104 and across the collector junction 103 as best seen in FIGURE 27. The isolation layers 112 may consist of ceramic materials containing $MgO/SiO_2$ or silicon-magnesium-oxides or any of a variety of silicates. There is a concentration gradient of the metal present. At the interface between the isolation layer 112 and the silicon, there is produced a layer 113, this oxide layer having a high proportion of silicon, and being dense and securely bonded to the substrate. At regions farther removed from the layer 113, the relative proportion of the added metal becomes greater with the result that a powdery oxide is formed. In this connection, it should be noted that where the metal is aluminum, the oxidation treatment should be carried out as rapidly as possible, since aluminum is a P-type impurity with respect to silicon, and diffusion into the silicon should be curtailed.

The isolation layers 112 thus formed have insulating properties so that the emitter junction 109 and the collector junction 103 are electrically isolated from each other by the isolation layers 112. Thus, there is provided a semiconductor device in which a plurality of transistor elements have a common collector region 104 on a common substrate. The powdery portion of the isolation layer 112 is not harmful in use, but since it is only lightly bonded to the substrate, it is possible to remove the powdery portion to form a recess 114 as illustrated in FIGURE 28. Removal of the pattern material leaves the relatively dense film 113 having a relatively high proportion of silicon in it.

In the succeeding step, the oxide layer 102 and the emitter region 104 and selected areas of the oxide film 113 are removed to form windows through which electrodes 116 are vapor deposited. Leads 117 are then attached to the electrodes, if necessary, as illustrated in FIGURE 29.

In the semiconductor device thus produced, the transistor elements are electrically interconnected and have a common collector region 104. The base, the emitter, the collector junction 103 and the emitter junction 109 of each transistor element are isolated from corresponding elements of other transistors by the oxide layer 113.

The P-N junctions 103 and 109 of these transistor elements are covered by the isolating oxide layer 113 and so are not exposed. Therefore, the junctions are less likely to become contaminated or broken, thereby reducing the possibility of lowering the breakdown voltage of the finished transistor.

The thermal expansion coefficients of silicon, magnesium oxide, aluminum oxide and silicon dioxide are $4.2\times10^{-6}$, 12 to $14\times10^{-6}$, 4 to $5\times10^{-6}$, and $0.54\times10^{-6}$, respectively. It is accordingly possible to select the thermal expansion coefficient of the isolation layer 113 to be substantially equal to that of the silicon by suitable selection of the relative amounts of aluminum and magnesium with respect to silicon as well as the temperature and time for the alloying treatment and the oxidation treatment. This eliminates the possibility of causing mechanical distortion of the P-N junctions resulting from differences in the thermal expansion coefficients between the isolation layer 113 and silicon, thereby avoiding the variations or deterioration of the characteristics of the transistor due to mechanical distortion of the P-N junction.

While the foregoing has described the production of NPN-type transistor elements, it will be seen that PNP-type transistors can also be produced by similar manufacturing processes. Furthermore, while in the manufacturing processes described above, the P-N junctions are formed prior to the formation of the isolation layer, it is also possible to form the P-N junctions 103 and 109 subsequent to the formation of the isolation layer.

The present invention has been described in connection with a situation where a plurality of transistors are formed on a common substrate with a common collector region, but this invention is equally applicable to the production of other types of semiconductor devices including a plurality of circuit members such as networks, semiconductor integrated circuits, or combinations of these formed on a common substrate while being electrically isolated from one another.

In the form of the invention illustrated in FIGURES 30 to 32, inclusive, there is first provided a silicon substrate 121 of P-type, N-type or I-type conductivity. A glass forming element such as magnesium is first deposited by vapor deposition to form spaced deposits 122 on one surface and a continuous film 123 on the opposite surface. Next, the remaining substrate is subjected to oxidation to form oxide deposits 124 at the upper surface of the substrate, and an oxide deposit 125 extending upwardly from the lower surface of the semiconductor elements. Those areas not in proximity to the metal are essentially free of any oxide formation except for a surface oxide film 126, thereby leaving a plurality of spaced semiconductor portions 127. These semiconductor portions 127 are isolated from each other by the oxide deposits 124. The powdery portions of the oxide deposits 124 and 125 can be removed, if desired, leaving a strongly bonded insulating film 128 over the semiconductor portions 127. Through the provision of suitable windows in the film, various circuit elements 129 can be incorporated into the semiconductor areas 127, such as unit semiconductor circuit elements, semiconductor integrated circuits, or suitable combinations of these.

Figures 35, 36, 37, 38, 39, 40, 41, 42, 43:
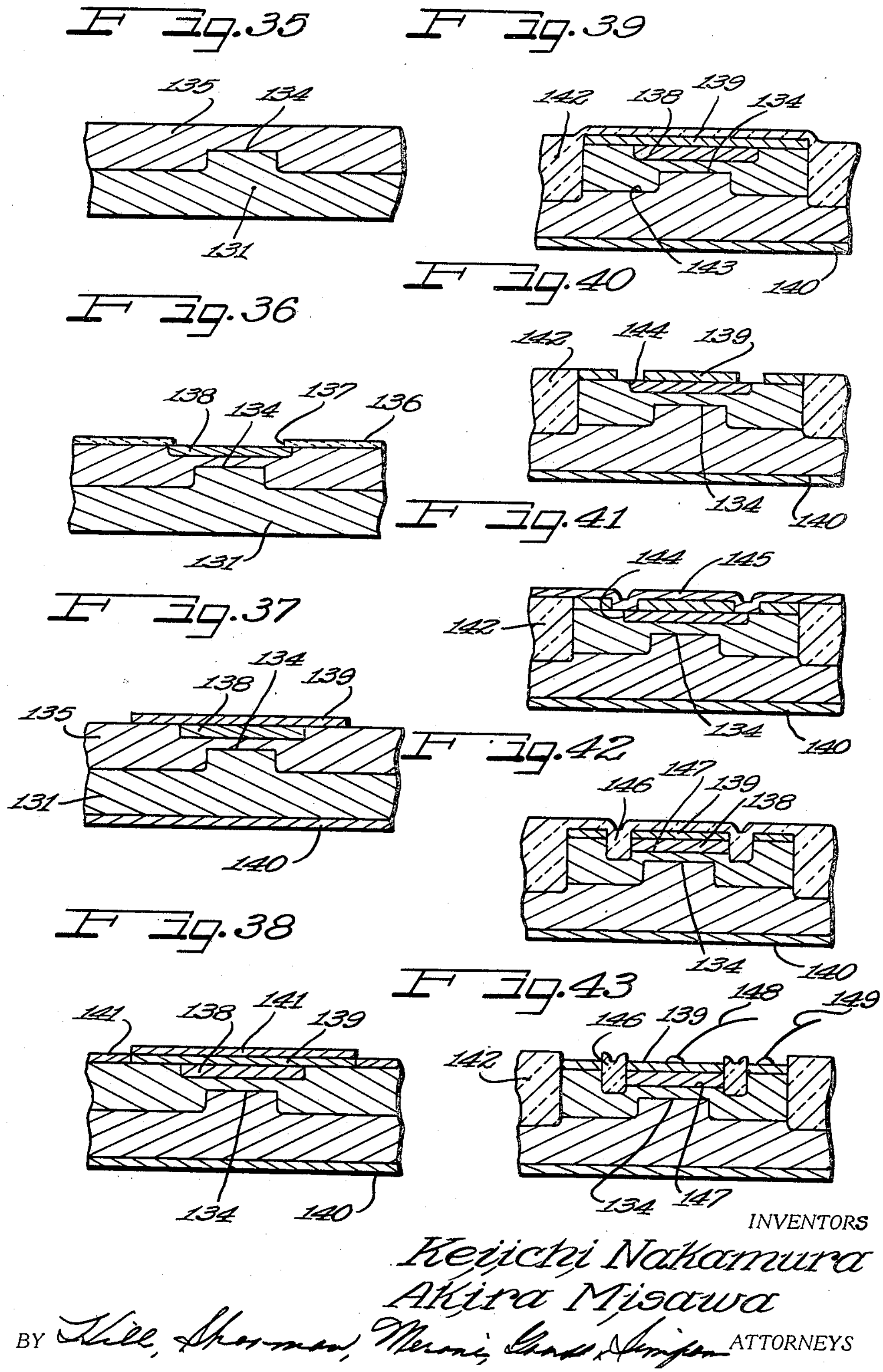

In the form of the invention illustrated in FIGURES 33 to 43, inclusive, we first provide an N-type silicon substrate 131 and form a silicon dioxide layer 132 over a selected portion of the substrate. Then, an acceptor impurity is diffused into the substrate 131 to form P-type regions 133, the areas underlying the silicon dioxide film 122 being protected against direct diffusion of the impurity. After removal of any remaining silicon dioxide film 132, a P-type epitaxial layer is deposited on the substrate 131 to form a trapezoidal P-N junction 134 covered by a continuous P-type layer 135. The next step consists in applying an overlying silicon dioxide layer 136 over the substrate and then diffusing an N-type impurity through a window 137 formed in the silicon dioxide layer 136 to form an emitter layer 138 which has a larger area than the junction 134. Upon removal of the silicon dioxide layer 136, as illustrated in FIGURE 37, a tungsten layer 139 is deposited over the emitter region 138 and a second tungsten layer 140 is deposited on the underside of the substrate. Then, a layer of lead oxide 141 is deposited over the upper surface of the semiconductor element, and over the tungsten layer 139. Upon heating the substrate in oxidizing atmosphere, a glass layer 142 is formed, the depth of the glass layer extending at least to the collector junction 143 located below the trapezoidal collector junction 134. The next step consists in removing the glass layer which overlies the tungsten layer 139 and selectively removing portions of the tungsten layer 139 which overlie the emitter junction 144. A lead oxide layer 145 (FIGURE 41) is then deposited over the entire upper surface. The substrate is again heated in an oxidizing atmosphere to form a glass layer 146 extending to beneath the lower portion of the emitter junction designated at reference numeral 147 in FIGURE 42. Portions of the glass layer are then selectively removed, and suitable leads 148 and 149 are secured to the tungsten layer 139.

In view of the geometry of the device described, it is not necessary to control the depth of penetration of the glass layer 146 accurately. In addition, since the transistor which results has a thin base layer, the base resistance is substantially reduced.

It will be evident that various modifications can be made to the described embodiments without departing from the scope of the present invention.

We claim as our invention:

1. The method of making a passivated semiconductor device comprising the steps of providing silicon substrate having at least one P-N junction, depositing readily oxidizable metal which alloys with silicon at a temperature less than the melting point of silicon on a preselected area of the substrate to be passivated, and heating the resulting substrate in an oxidizing atmosphere to cause formation of a region of isolating oxide in said substrate extending to said P-N junction.

2. The method of claim 1 in which the region of isolating oxide extends at least to that portion of the P-N junction which is parallel to the surface of the substrate.

3. The method of claim 1 in which a film of the readily oxidizable metal is also applied to the opposite surface of said substrate.

4. The method of making a passivated semi-conductor device comprising the steps of providing a silicon substrate having a first P-N junction at one level thereof, diffusing an impurity into said substrate to provide a second P-N junction at a different level in said substrate, diffusing a readily oxidizable metal which alloys with silicon at a temperature less than the melting point of silicon into said substrate to both levels and heating said substrate in an oxidizing atmosphere to cause formation regions of isolating oxides extending to each of said levels.

5. The method of claim 1 in which said readily oxidizable metal includes lead.

6. The method of claim 1 in which said readily oxidizable metal includes magnesium.

7. The method of claim 1 in which said readily oxidizable metal includes aluminum.

8. The method of claim 1 in which said readily oxidizable metal includes beryllium.

9. The method of claim 1 in which said readily oxidizable metal includes zinc.

10. The method of making a passivated semiconductor device which comprises the steps of applying a barrier film on a preselected area of a silicon substrate of one conductivity type, diffusing an impurity of the opposite conductivity type into said substrate about said barrier film to provide a first P-N junction within said substrate, removing the barrier film, expitaxially growing a layer of said opposite conductivity type on said substrate, diffusing an impurity of said one conductivity type into said substrate short of the level of said first P-N junction, applying a metal electrode over the diffused area, applying a readily oxidizable metal which alloys with silicon at a temperature less than the melting point of silicon over said substrate and over said metal electrode, and heating the resulting substrate under oxidizing conditions to cause formation and diffusion of a region of isolating oxide extending through the epitaxially grown layer.

References Cited

UNITED STATES PATENTS

| | | | |
|---|---|---|---|
| 2,794,846 | 6/1957 | Fuller | 148—188 XR |
| 3,093,507 | 6/1963 | Lander et al. | 117—201 |
| 3,158,505 | 11/1964 | Sandor | 117—106 XR |
| 3,231,421 | 1/1966 | Schmidt | 148—187 XR |
| 3,279,963 | 10/1966 | Castrucci et al. | 148—187 XR |
| 3,433,686 | 3/1969 | Marinace | 148—175 |

L. DEWAYNE RUTLEDGE, Primary Examiner

E. L. WEISE, Assistant Examiner

U.S. Cl. X.R.

148—187; 317—234